(12) United States Patent
Tonomura et al.

(10) Patent No.: US 6,541,379 B2
(45) Date of Patent: Apr. 1, 2003

(54) WIRING FORMING METHOD FOR SEMICONDUCTOR DEVICE

(75) Inventors: Shoichiro Tonomura, Fuji (JP); Toyohiko Kuno, Nobeoka (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 10/115,252

(22) Filed: Apr. 4, 2002

(65) Prior Publication Data

US 2002/0105090 A1 Aug. 8, 2002

Related U.S. Application Data

(62) Division of application No. 09/380,780, filed as application No. PCT/JP98/00939 on Mar. 6, 1998, now Pat. No. 6,384,484.

(30) Foreign Application Priority Data

Mar. 10, 1997 (JP) .............................. 9-054593

(51) Int. Cl.$^7$ .............................. H01L 21/44
(52) U.S. Cl. ................. 438/688; 438/680; 438/685
(58) Field of Search ................. 438/660, 672, 438/678, 680, 685, 620, 637–641

(56) References Cited

U.S. PATENT DOCUMENTS

| | | |
|---|---|---|
| 4,988,412 A | 1/1991 | Liu et al. |
| 5,188,723 A | 2/1993 | Yu et al. |
| 5,602,423 A | 2/1997 | Jain |
| 5,676,587 A | 10/1997 | Landers et al. |
| 5,702,982 A | 12/1997 | Lee et al. |
| 5,824,599 A | 10/1998 | Schacham-Diamand et al. |
| 5,960,320 A | * 9/1999 | Park .................. 438/688 |
| 5,968,333 A | * 10/1999 | Nogami et al. ........ 205/184 |

FOREIGN PATENT DOCUMENTS

| | | |
|---|---|---|
| JP | 59-205735 | 11/1984 |
| JP | 7-99199 | 4/1995 |
| JP | 7-283219 | 10/1995 |

OTHER PUBLICATIONS

English Abstract of Japanese Application No. 58080357, dated May 9, 1983.
English Abstract of Japanese Application No. 06100697, dated Apr. 13, 1994.
English Abstract of Japanese Application No. 05351285, dated Dec. 29, 1993.

* cited by examiner

*Primary Examiner*—David Nelms
*Assistant Examiner*—Dung A Le
(74) *Attorney, Agent, or Firm*—Finnegan, Henderson, Farabow, Garrett & Dunner, L.L.P.

(57) ABSTRACT

Grooves and holes of high aspect ratio are filled completely and uniformly. After forming connection holes (3) and wiring grooves (4) in a silicon oxide film (2) which is formed on a silicon substrate (1), a TiN film (5) is formed over the entire surface of the semiconductor substrate and a Ti film (6) is formed on the region except for the connection holes (3) and the wiring grooves (4). Then, in a state where the connection holes (3) and the wiring groove (4) are dipped in a plating solution, a plating treatment is carried out under a deposition overvoltage higher than the deposition overvoltage of TiN to copper and lower than the deposition overvoltage of Ti to copper. Since plating is thus applied only to the portion where the TiN film (5) is exposed, namely, only to the portion of the connection holes (3) and the wiring grooves (4), the connection holes (3) and the wiring grooves (4) are filled with copper and when they are polished by a chemical and mechanical polishing method to form wirings, satisfactory copper wiring which are uniform and well filled can be obtained.

9 Claims, 4 Drawing Sheets

WIRING FORMING METHOD FOR SEMICONDUCTOR DEVICE

CROSS REFERENCE TO A RELATED PATENT

The subject matter of the present application is related to an U.S. Pat. No. 6,384,484 filed on Sep. 9, 1999, which is also assigned to the assignee of the present invention.

This is a division of application Ser. No. 09/380,780, filed Sep. 9, 1999 now U.S. Pat. No. 6,384,484 which is a 371 of PCT/JP98/00939, filed Mar. 6, 1998, which is incorporated herein by reference.

TECHINICAL FIELD

The present invention relates a wiring forming method for a semiconductor device and a semiconductor device of forming wirings made of a metal material in connection holes or wiring grooves formed on a semiconductor substrate for conducting connections between wirings and semiconductor substrates and, more in particular, it enables complete and uniform filling of the metal material into connection holes or wiring grooves without complicating a production process.

BACKGROUND ART

Wirings in integrated circuits such as LSIs have been generally formed by fabricating films of aluminum (Al) series alloys deposited by a sputtering method by using, for example, photolithography or dry etching.

However, along with increasing degree of integration in semiconductor integrated circuits, diameters for connection holes or diameters for wiring grooves apertured for conducting connection between wirings and semiconductor substrates have become finer and an aspect ratio of them has been increased more and more. Therefore, it is difficult to form wirings at a predetermined thickness as far as the inside of the connection holes by the sputtering method to result in a problem of lowering the step coverage, increasing the resistance of contact hole wirings and deteriorating electromigration durability.

In order to avoid them, a method of forming wirings to a vertical wiring portion in connection holes by a CVD method (chemical vapor deposition method) using tungsten (W) is adopted in LSIs under a design rule below half-micron.

However, in the existent method of forming wirings by the CVD method using tungsten, since the resistance of tungsten is high, it is necessary to leave a tungsten film formed on the entire surface of a substrate only in the connection holes while removing other portions by a dry etching method or chemical and mechanical polishing method (CMP) and form wirings of an aluminum series alloy again. Therefore, this gives rise to a problem of making the wiring forming step lengthy to increase the cost.

On the other hand, as the size for the wirings has become finer, it has been desired for wiring materials of high electro-migration durability and low resistance, and a film deposition method and a wiring fabrication method have now been under study for using copper capable of satisfying such a demand for the wiring material.

However, since a film of copper can not be deposited uniformly in a connection hole by a usual sputtering method, a method of depositing the copper film by a CVD method has been studied, but it still leaves a subject such as for the development of organic metal compounds of copper as a starting material and the development for CVD apparatus.

Further, while an electrolytic plating method for copper has also been studied, electrodeposition proceeds at the periphery outside of the fine connection holes or wiring grooves to at first close inlets for the connection holes or wiring grooves, which causes a problem of difficulty for filing copper in the fine connection holes without forming voids.

Further, it is difficult to fabricate copper by dry etching and it has been proposed, for example, a DUALDER machine method of forming contact holes and wiring grooves to an insulation film, depositing copper for the entire surface and then removing excess copper by a chemical and mechanical polishing method thereby properly forming wirings having vertical connection portions. Development for the technique of properly filling and depositing a copper film into hole or groove portions of high aspect ratio such as connection hole or wiring grooves has also been desired with an aim of applying to this method.

In view of the above, the present invention has been accomplished taking notice of the foregoing not yet solved subject and it is an object thereof to provide a selective plating method capable of completely, and uniformly filling groove or hole portions of high aspect ratio and a wiring forming method for a semiconductor device using the same, as well as a semiconductor device using the method.

DISCLOSURE OF THE INVENTION

In order to attain the foregoing object, the present invention provides a method of forming wirings for a semiconductor device, which comprises the steps of forming concaved wiring channels in an insulation film deposited on a semiconductor substrate, forming a first conductor layer having a first deposition overvoltage as a deposition overvoltage required for depositing a copper series metal material in a plating solution at a predetermined rate to the surface of the insulation film including the inner surface of the concaved portion of the wiring channels, then forming thereon a second conductor layer having a second deposition overvoltage higher than the first deposition overvoltage as the deposition overvoltage so as to cover a region except for the inner surface of the concaved portion of the wiring channels, subsequently, dipping at least the inner surface of the concave portion of the wiring channels into the plating solution and applying a plating treatment at a deposition overvoltage higher than the first deposition overvoltage and lower than the second deposition overvoltage to deposit the copper series metal material, and polishing the deposited metal material thereby form wirings.

That is, the first conductor layer having the first deposition overvoltage as the deposition overvoltage is formed to a region including the inner surface of the concaved portion of the wiring channels such as connection holes or wiring grooves formed in the concaved shape to the insulation film deposited on the semiconductor substrate, for example, by a CVD method, and then the second conductor layer having the second deposition overvoltage as the deposition overvoltage is formed thereon so as to cover the surface of the insulation film except for the inner surface of the concaved portion of the wiring channels, for example, by a sputtering method. Then, they are dipped in the plating solution such that at least the entire surface of the inner surface of the concaved portion of the wiring channels is dipped in the plating solution, and plating is applied at a deposition overvoltage higher than the first deposition overvoltage and lower than the second deposition overvoltage. Since the deposition overvoltage is a voltage required for depositing the copper series metal material in the plating solution at a predetermined rate, the metal material is not deposited on a portion in which the second conductor layer is exposed, whereas chemical reactions are taken place between the metal material in the plating solution and the first conductor layer to deposit the metal material and apply copper plating to the portion in which the first conductor layer is exposed. That is, since copper plating is applied only to the portion in which the first conductor layer is exposed, namely, only to the inside of the concaved portion of the wiring channels intended to be applied with plating, to result in a copper-filled state, a wiring consisting of copper filled in the wiring channels can be obtained by polishing the copper.

In this case, the second conductor layer is preferably formed by a highly anisotropic deposition method. This is done for forming the second conductor layer to a region except for a region to be plated, namely, only to a region except for the wiring channels and the formation of the second conductor layer to the wiring channels can be avoided.

Further, it is preferred that each wiring channel has an aspect ratio of 1 or greater and 5 or less and a width of 1.0 $\mu$m or less. This is so defined for avoiding the formation of the second conductor layer at the bottom of the wiring channels upon forming the second conductor layer, for example, by a sputtering method.

Further, in a case of applying to a semiconductor device of a multi-layered wiring structure, plating is applied to form wirings and then wirings are conducted by forming a metal film further thereon. When wirings are formed on an insulator, a thin electrically conductive film is generally put between them with an aim, for example, of improving adhesion and electro-migration durability. In this case, since the first conductor layer is formed over the surface of the semiconductor substrate, the step of forming wirings can be shortened by utilizing the layer as the thin electrically conductive film.

Further, the deposited metal material is preferably polished by a chemical and mechanical polishing method by which the wirings can be formed easily and accurately.

Further, when making the first conductor layer with titanium nitride, the second conductor layer with titanium and the metal material with the copper series metal material, copper wirings uniformly filled in the concaved portion of the wiring channels can be formed by forming a titanium nitride film to a region including the inner surface of the concaved portion of the wiring channels such as connection holes or wiring grooves, forming a titanium film so as to cover the surface of the insulation film except for the wiring channels and then dipping them into a plating solution.

Further, the present invention provides a semiconductor device comprising a first conductor layer formed to the surface of an insulation film including the inner surface of a concaved portion of concaved wiring channels formed in the insulation film on a semiconductor substrate and having a first deposition overvoltage as a deposition overvoltage required for depositing a copper series metal material in a plating solution at a predetermined rate, a second conductor layer formed thereon after the formation of the first conductor layer so as to cover a region except for the inner surface of the concaved portion of the wiring channels and having a second deposition overvoltage higher than the first deposition overvoltage as the deposition overvoltage, and wirings formed by dipping a portion at least including the first conductor layer in the plating solution, applying a plating treatment at a deposition overvoltage higher than the first deposition overvoltage and lower than the second deposition overvoltage and polishing the copper series metal material deposited on the inner surface of the concaved portion in which the first conductor layer is exposed by a chemical and mechanical polishing method.

That is, a first conductor layer having the first deposition overvoltage as the deposition overvoltage is formed on the surface of the insulation film including the inner surface of the concaved portion of the wiring channels such as the connection holes or the wiring grooves formed in the insulation film on the semiconductor substrate and, after the formation of the first conductor layer the second conductor layer having the second deposition overvoltage as the deposition overvoltage is formed thereon so as to cover the region except for the inner surface of the concaved portion of the wiring channels. Further, the first conductor layer not covered with the second conductor layer is formed with a film of the metal material, that is, copper deposited by applying a plating treatment at a deposition overvoltage higher than the first deposition overvoltage and lower than the second deposition overvoltage in a state of dipping the inner surface of the concaved portion of the wiring channels in the plating solution and the metal film is polished by the chemical and mechanical polishing method to form the wirings. That is, wirings are formed in a state of filling copper only in the wiring channels. Since the wirings made of copper are formed by applying copper plating, copper for the wirings can be filled uniformly to obtain wirings of high performance even if the size of wiring channels is fine.

When making the first conductor layer with titanium nitride, the second conductor with titanium and the metal material with the copper series metal material, copper wirings filled uniformly in the concaved portion of the wiring channels can be obtained by forming a titanium nitride film to a region including the inner surface of the concaved portion of the wiring channels such as connection holes or wiring grooves, forming a titanium film so as to cover the surface of the insulation film except for the wiring channels and then dipping them in a plating solution.

Further, the present invention provides a selective plating method, which comprises the steps of forming a first conductor layer having a first deposition overvoltage as a deposition overvoltage required for depositing a metal material in a plating solution at a predetermined rate to a portion including a plating region to be plated in the surface of a material to be plated, then forming thereon a second conductor layer having a second deposition overvoltage higher than the first deposition overvoltage as the required deposition overvoltage so as to cover a region except for the plating region, subsequently, and dipping the material to be plated into the plating solution and applying a plating treatment at a deposition overvoltage higher than the first deposition overvoltage and lower than the second deposition overvoltage.

That is, the first conductor layer having the first deposition overvoltage as the deposition overvoltage as the deposition overvoltage is formed on the surface of the material to be plated including the plating region for applying plating, and the second conductor layer having the second deposition overvoltage higher than the first deposition overvoltage as the deposition overvoltage is then formed thereon so as to cover the region except for the plating region. That is, since the second conductor layer is formed so as to cover the region not applied with plating, the second conductor layer is formed also in a case where the first conductor layer is formed in the not plated region, so as to cover the first conductor layer in such a region. Therefore, the first conductor layer is exposed only in the plating region. Then, the material to be plated is dipped in the plating solution and applied with the plating treatment at a deposition overvoltage higher than the first deposition overvoltage and the lower than the second deposition overvoltage. That is, in a case of electrolytic plating, for example, an electrode voltage higher than the first deposition overvoltage and lower than the second deposition overvoltage is set between the underlying metal to be applied with plating, that is, the first conductor layer in this case and the counter-electrode and, in a case of electroless plating, the oxidation reduction potential of an oxidant is set such that it is higher than the first deposition overvoltage and lower than the second deposition overvoltage.

In this case, since the deposition overvoltage is a voltage required for depositing the metal material in the plating solution at a predetermined rate, plating is not applied to the portion in which the second conductor layer is exposed since the plating treatment is conducted at a voltage lower than the second deposition overvoltage and no chemical reaction is taken place. On the other hand, chemical reaction is taken place between the first conductor layer and the metal material in the plating solution at a portion in which the first conductor layer is exposed, to form a film of electrolysis products in a case of the electrolytic plating and of deposition products by oxidizing reaction between the metal material and a reducing agent in a case of the electroless plating, and plating is applied by the metal material in the plating solution. Therefore, plating is applied only to the region in which the first conductor layer is exposed, namely, plating is applied only to the plating region.

When the first conductor layer is formed to the region at least including the inner surface of the concaved portion and the second conductor layer is formed so as to cover the region except for the inner surface of the concaved portion, the first conductor layer having the first deposition overvoltage as the deposition overvoltage is formed at least in the region including the inner surface of the concaved portion and the second conductor layer having the second deposition overvoltage as the deposition overvoltage is formed so as to cover the region except for the inner surface of the concaved portion. Accordingly, plating is applied only to the region in which the first conductor layer is exposed, that is, only to the inner surface of the concaved portion by dipping the material to be plated in the plating solution and applying plating at a deposition overvoltage higher than the first deposition overvoltage and lower than the second deposition overvoltage. Since a metal film of an optional thickness can be obtained depending on the dipping time, a metal film with no voids and of uniform thickness filled in the concaved portion can be obtained, for example, also in a case of a fine concaved portion.

Further, when making the first conductor layer with titanium nitride, the second conductor layer with titanium and the metal material with the copper series metal material, a uniform copper metal film can be formed easily only to the region in which the titanium nitride is exposed, for example, by forming a titanium nitride film at least including a region intended to be formed with a copper metal film and, forming a titanium film so as to cover other region than the above and then dipping them into the plating solution.

BRIEF DESCRIPTION OF THE DRAWINGS

FIGS. 1(a)–2(c) are fragmentary cross sectional views depicting one embodiment of the invention at different stages during its manufacturer;

BEST MODE FOR PRACTICING THE INVENTION

Figure 1:
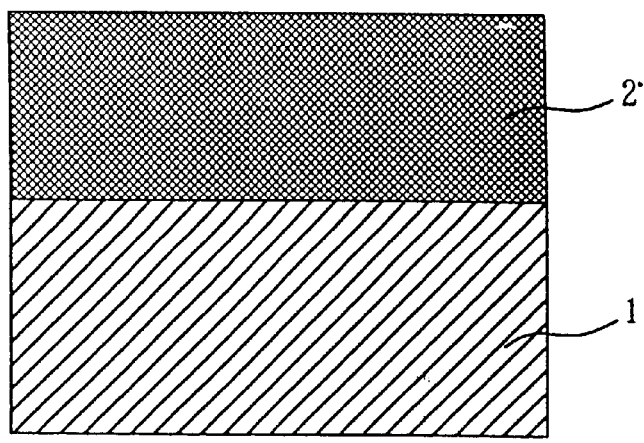
Figure 1:
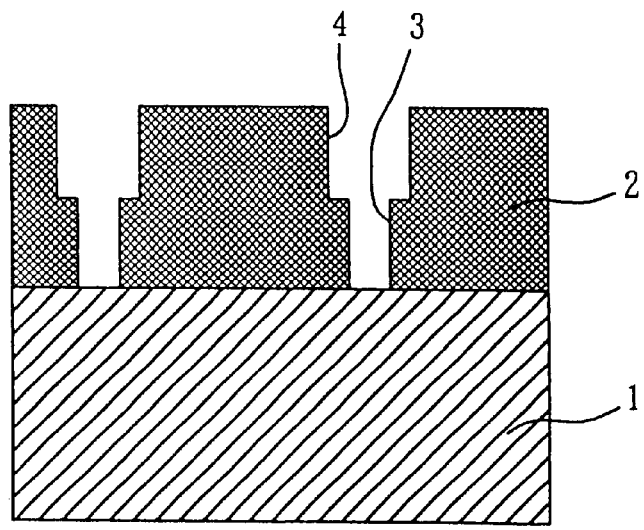
Figure 1:
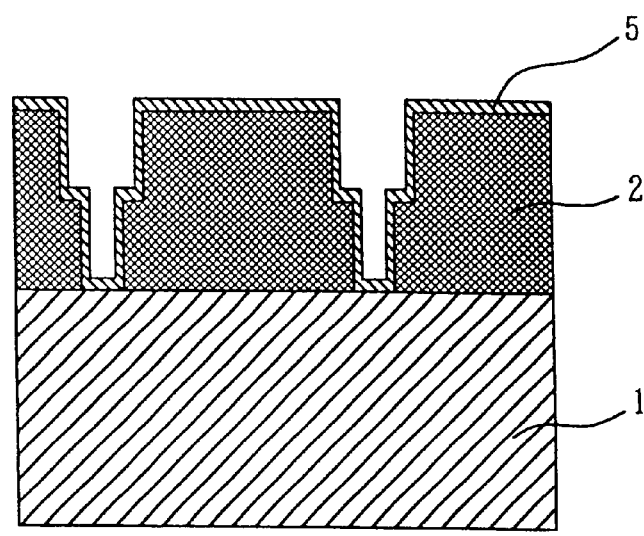

The mode of practicing the present invention is to be explained.

Generally, in electrolytic plating of a metal, an electrode potential is set to a potential which is negative by an overvoltage than a thermodynamic equilibrium potential required for reducing to deposit metal ions in the plating solution. In electroless plating, a reducing agent having a reducing power (oxidation/reduction potential) higher than an equilibrium potential required for depositing metal ions is used.

Deposition by reduction of metal ions does not proceed at a substantial rate even if a thermodynamic equilibrium electrode potential or an oxidant providing an oxidation/reduction potential is used, and an overvoltage required for proceeding substantial reaction is different depending on the kind of the underlying metal. That is, there is a phenomenon that the electrode potential or the oxidation/reduction potential of the reducing agent (hereinafter referred to as a deposition overvoltage) required in excess of the thermodynamical equilibrium potential is different depending on the kind of the underlying metal.

When copper film is deposited by using substrates formed with underlying metals of various deposition overvoltages by utilizing the above described phenomenon, it has been found a phenomenon that copper deposits only to the portion in which metal of low deposition overvoltage is exposed and, thus, a selective copper plating method has been found.

That is, for depositing copper only in the wiring grooves or the connection holes formed in the insulation film, a first underlying metal having a lower deposition overvoltage as the first deposition overvoltage is selected and deposited as a film on a portion to be deposited with copper, a second underlying metal having a deposition overvoltage higher than the first deposition overvoltage as a second deposition overvoltage is selected and deposited as a film to a portion not intended to be deposited with copper, and a voltage higher than the first deposition overvoltage and lower than the second deposition overvoltage is set as an electrode potential relative to a counter-electrode in a case of electrolytic plating, whereas a oxidation/reduction potential of a reducing agent is set higher than the first deposition overvoltage and lower than the second deposition overvoltage in a case of electroless plating.

Therefore, copper is deposited to form a metal film only to a portion in which the first underlying metal is exposed. Accordingly, plating is conducted till copper is deposited as far as the upper surface of the wiring grooves and the connection holes, to provide a state in which a metal film of the deposited copper is filled in the wiring grooves and the contact holes. Accordingly, wirings of copper filled in the wiring grooves and the connection holes can be obtained by polishing the deposited copper by a chemical and mechanical polishing method to remove unnecessary portion.

When wirings of aluminum or copper are formed on the insulation film, dense thin electrically conductive films such as of titanium nitride (TiN) are formed generally at the boundary between the insulation film and the wirings with various purposes such as prevention of diffusion, improvement of adhesion and improvement of electro-migration durability. Since such films have higher resistance compared with aluminum or copper, it is not preferred to make them unnecessarily thick. In the electrolytic plating, electric current can be supplied through the underlying metal such as titanium nitride formed as a film on the entire surface of the insulation film. Accordingly, when titanium nitride is used as the first underlying metal having the first deposition overvoltage as the deposition overvoltage and deposited as a film on the entire surface of the insulation film, and then a film of metal such as titanium having a high deposition overvoltage is formed thinly by a highly anisotropic deposition method such as sputtering to a portion not intended to apply plating, namely, a region except for the side wall and the bottom of the connection holes and the wiring grooves, a copper film is not formed to the titanium deposited portion and copper can be deposited substantially only to the portion not deposited with titanium, namely, only to the side wall and the bottom of the connection holes and the wiring grooves.

Accordingly, in a state of forming the wirings in the connection holes or the wiring grooves formed in the insulation film, since the film of titanium nitride is deposited on the surface of the semiconductor substrate, the titanium nitride film can be utilized as the thin electrically conductive film for the improvement of the adhesion and improvement of the electro-migration durability, so that it is not necessary to form an additional thin electrically conductive film, for example, in a case of applying wirings in the multi-layered wiring structure, and the wiring forming step can be saved.

The second underlying metal having the second deposited overvoltage as the deposition overvoltage is deposited as a film, for example, by the sputtering method, but the metal of high deposition overvoltage adheres to the bottom of the wiring grooves and the connection holes if the width of the wiring grooves and the diameter of the connection holes are large. Therefore, the width of the grooves and the diameter of the connection holes are preferably 1.0 $\mu$m or less, and the aspect ratio as the width to depth ratio in the wiring grooves and the connection holes is preferably from 1 to 5. If necessary, preferred deposition can be applied by providing a cleaning step before electrodeposition by electrolytic plating.

Accordingly, since the metal film of copper is formed so as to fill the wiring grooves and the like by applying plating described above, voids are not formed in the metal film and a uniform copper film can be obtained.

Further, wirings can be formed effectively even in fine wiring grooves or connection holes and, in addition, copper having high electro-migration durability and low resistance can be used as the wiring material, so that the method can be applied even to fine wiring grooves or suitable to connection holes and it is preferred in a case of forming fine wirings such as the connection portions between a silicon substrate and wirings, or between wiring layers in a multi-layered wiring structure. Furthermore, since fine wirings can be formed, the size of the semiconductor substrate can be reduced.

Further, selective deposition is possible also by a method of masking a portion not intended to deposit copper, namely, a portion not intended to apply plating with an insulation film and this method is customary. In this method, however, adhesion of the insulation film, even in a slight amount, to the inside of the wiring grooves increases the resistance to bring about a problem. In addition, since the insulation film for the unnecessary portion has to be removed completely after deposition, it is not efficient to make the step of forming wirings lengthy. In the above described embodiment, since the plating solution has only to be dipped after deposition of titanium nitride and titanium films, wirings of high performance can be conducted in a shorter wiring forming step.

The conductors of different deposition overvoltages can be easily determined experimentally in accordance with the kind of metal to be deposited. For example, if the metal to be deposited is copper, copper (CU), zinc (Zn) or gold (Au) can be used for the conductor of low deposition overvoltage and, on the other hand, iron (Fe), nickel (Ni), cobalt (Co), titanium (Ti) and tungsten (W) can be used for the conductor of high deposition overvoltage. Further, since the difference of the deposition overvoltage is relative, optional materials may be selected.

Further, if an insualtor is used instead of a metal of high deposition overvoltage, since an insulation film adhered thinly to the inside of the connection holes and the wiring grooves gives a high resistance, this is not appropriate, and use of a conductor having low resistance although having high deposition overvoltage is preferred.

Then, the above described embodiment is to be explained concretely with reference to examples.

As shown in FIG. 1($a$), a 6 inch substrate 1 of n-type Si (100) single crystal having a resistance of 2 $\Omega$cm was used as a semiconductor substrate and a silicon oxide insulation film 2 was formed to a thickness of 2.0 $\mu$m on the substrate by a plasma CVD method.

Then, a connection hole 3 and a wiring groove 4 were formed in the silicon oxide insulation film 2 by using a photolithographic method and a dry etching method (FIG. 1($b$)). The connection hole 3 had a 0.6 $\mu$m diameter and a 1.0 $\mu$m width and the wiring groove 4 had a 0.8 $\mu$m width and a 1.0 $\mu$m depth. The connection hole 3 and the wiring groove 4 correspond to the wiring channel.

Then, a titanium nitride film (first conductor layer) 5 having a deposition overvoltage of about −100 mV was deposited to a thickness of 0.1 $\mu$m over the entire surface of the semiconductor substrate 1 by a CVD method (FIG. 1($c$)). The deposition overvoltage of titanium nitride is a value based on a saturation calomel electrode.

For the method of depositing the titanium nitride film, a usual sputtering method, a sputtering method using a collimator, a long distance sputtering method or the like is adopted and the use of a deposition method with high step coverage is more preferred.

Figure 2:
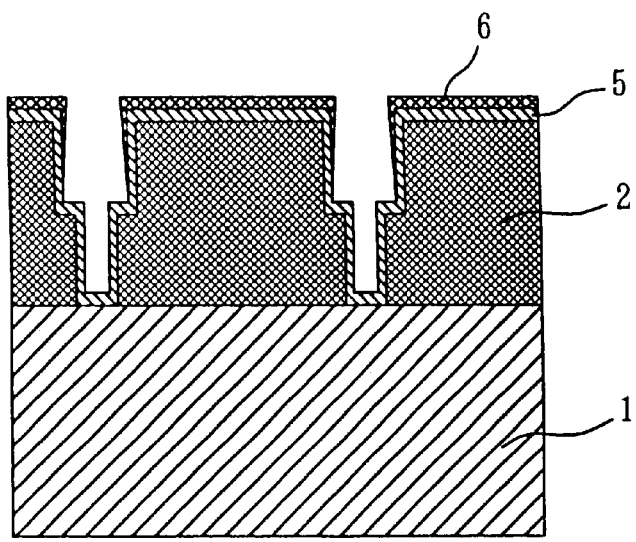
Figure 2:
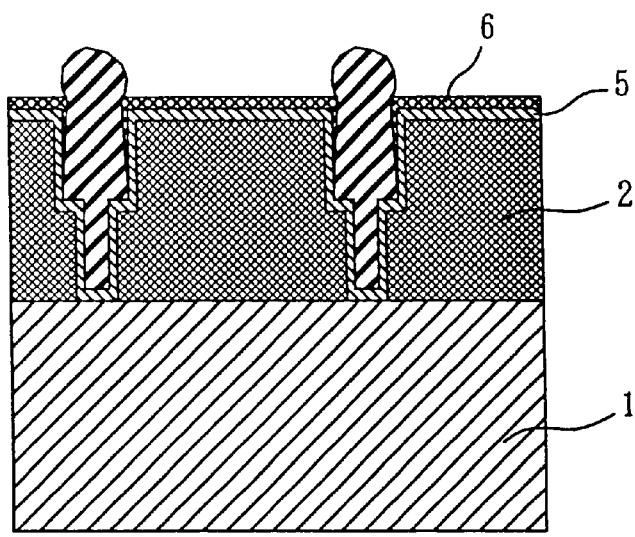
Figure 2:
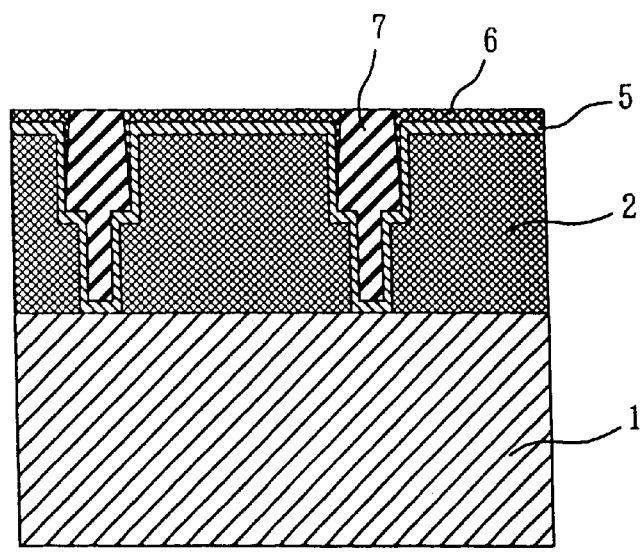

Then, titanium (second conductor layer) 6 having a deposition overvoltage of about −300 mV was deposited to a thickness of 0.03 $\mu$m on a flat surface, that is, a portion except for the connection hole 3 and the wiring groove 4 (FIG. 2($a$)). The deposition overvoltage of titanium is a value based on the saturation calomel electrode.

The specimen (material to be plated) was subjected to constant current electrolysis in a plating solution using copper sulfate (cupric metal material) using a copper electrode as a counter electrode, at a current of 50 mA for 10 min. The potential difference between both of the electrodes was about 200 mV.

In this process, if the current density is increased, electrodeposition for a predetermined of amount is completed within a shorter period of time but, since this increases the electrode potential and the selectivity due to the difference of overvoltage is lost, it is necessary to select the current density or the electrode potential within a range capable of developing the selectivity.

Then, after water washing, when this specimen was observed by an optical microscope, it was confirmed that copper was deposited only to the portion for the wiring groove and the connection hole but copper was not adhered to a flat portion, namely, a portion in which titanium 6 was deposited (FIG. 2(b)).

Then, the specimen was polished by a chemical and mechanical polishing method to remove excessively deposited copper thereby forming wirings 7 consisting of copper (FIG. 2(c)).

After forming the wirings 7, when a cross section was observed by a scatting type electron microscope, it could be confirmed that the wirings 7 were formed in a state where copper was filled in the connection hole 3 and the wiring groove 4.

Figure 3:
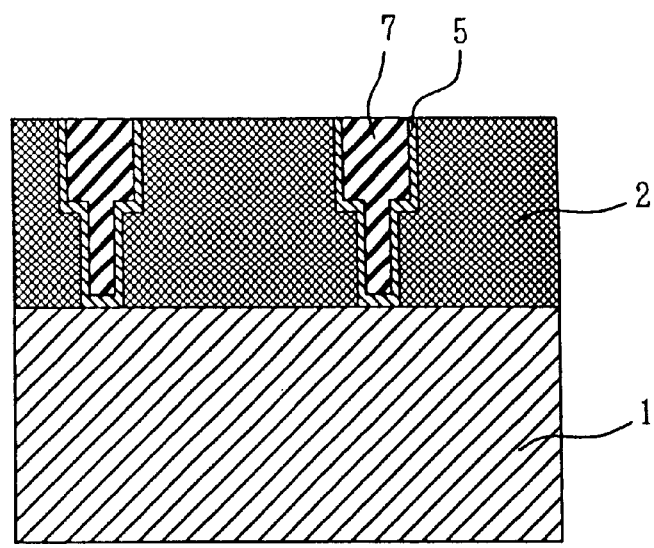
FIGS. 3(a)–(b) are cross sectional views of an alternative embodiment of the invention.
Figure 3:
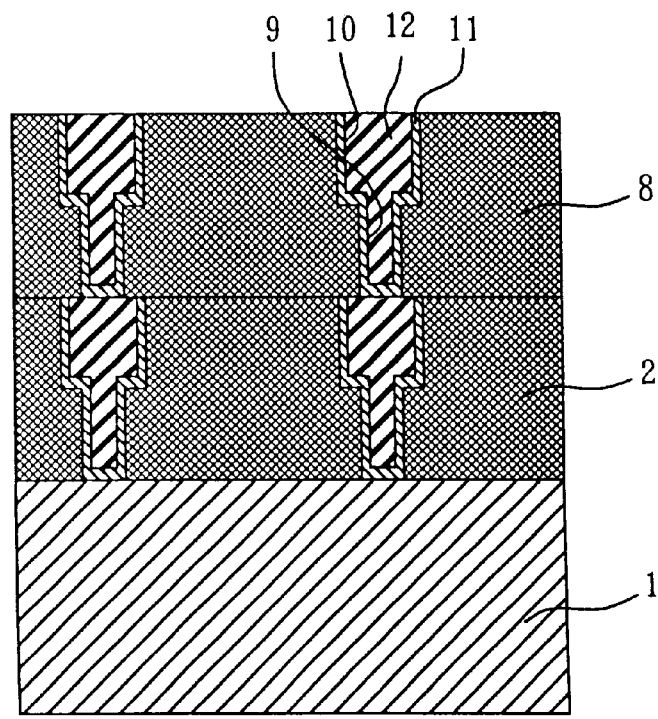

In the above described embodiment, although explanations have been made to a case of removing only the copper deposited excessively as shown in FIG. 2(c), the specimen may also be polished by using the chemical and mechanical polishing method to remove excessively deposited copper, titanium and titanium nitride as shown in FIG. 3(a) and, subsequently, applying molding, for example.

Alternatively, after removing the excessively deposited copper, titanium and titanium nitride as shown in FIG. 3(a), the silicon oxide insulation film 8 is formed again and, subsequently, a connection hole 9 and a wiring groove 10 are formed in the silicon oxide insulation film 8 as shown in FIG. 3(b) by repeating the procedures described above. Then, after depositing a titanium nitride film 11 to the entire surface of the specimen, a titanium film is deposited to a portion except for the connection hole 9 and the wiring groove 10, then plating is applied under the same conditions as described above, excess copper and the like are removed by polishing, thereby forming wirings 12 in the connection hole 9 and the wiring groove 10 to form multi-layered wiring.

Figure 4:
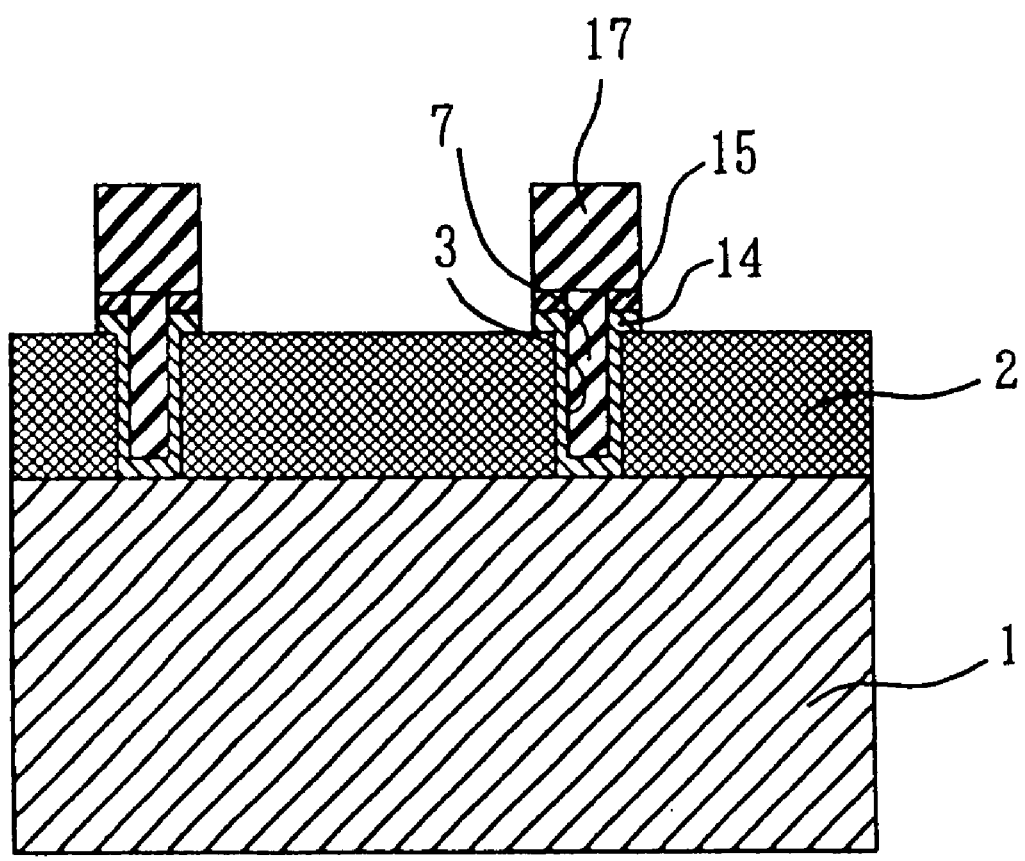
FIG. 4 shows an example of another example of the present invention.

Further, in the above described embodiment, although the explanations have been made to a case of forming the wirings 7 in the silicon oxide insulation film 2 but this is not restrictive. For example, as shown in FIG. 4, after forming only the connection hole 3 in a silicon oxide insulation film 2, a titanium nitride film 14 is deposited on the entire surface of the specimen, further, a titanium film 15 is formed to a region except for the connection hole 3, and then plating is applied to form wirings 7 in the connection hole 3 by deposition of copper. Then, excess copper is removed by polishing, a wiring film 17 is deposited further thereon, and the wiring film 17, the titanium film 15 and the titanium nitride film 14 are patterned together to form wirings. In a case of forming wirings on an insulation material, an electrically conductive thin film is generally put between them with an aim of improving the adhesion and improving the electro-migration durability. As shown in FIG. 4, the titanium nitride film 14 and the titanium film 15 are left upon polishing the deposited copper and the wiring film 17 is deposited on the titanium film 15, so that the titanium nitride film 14 can be utilized as the thin electrically conductive film to shorten the step of forming the wirings.

INDUSTRIAL APPLICABILITY

As has been described above, since the method of forming wirings for a semiconductor device according to the present invention comprises the steps of, forming a first conductor layer having a first deposition overvoltage as a deposition overvoltage to the surface of an insulation film including the inner surface of a concaved portion of wiring channels formed in an insulation film formed on a semiconductor substrate, then forming thereon a second conductor layer having a second deposition overvoltage as a deposition overvoltage so as to cover a region except for the inner surface of the concaved portion of the wiring channels, then dipping at least the inner surface of the concaved portion of the wiring channels in a plating solution and applying a plating treatment at a deposition overvoltage higher than the first deposition overvoltage and lower than the second deposition overvoltage thereby applying copper plating only to the inside of the wiring channels, and polishing the copper to form wirings. Therefore, wirings filled completely and uniformly in the wiring channels can be obtained easily.

In this case, if the second conductor layer is formed by a highly anisotropic deposition method, the second conductor layer can be formed only to the region except for a region to be plated, namely, only to the region except for the wiring channels, thereby enabling to prevent degradation for the uniformity of the metal film such as occurrence of voids in the metal film, caused by the formation of the second conductor layer to the wiring channels.

Further, if the aspect ratio of the wiring channel is from 1 to 5, and the width of the wiring channel is $1.0\,\mu m$ or less, it is possible to prevent degradation for the uniformity of the metal film such as occurrence of voids in the metal film caused by the formation of the second conductor layer in the wiring channels upon forming the second conductor layer.

Further, in a case of conducting wiring in a multi-layered wiring structure, the first conductor layer can be utilized as a thin electrically conductive film to be formed with an aim of improving the adhesion and improving the electro-migration durability, to shorten the step of forming wirings.

Further, when the deposited metal material is polished by the chemical and mechanical polishing method, the wirings can be formed easily and at a high accuracy.

Further, when making the first conductor layer with titanium nitride, the second conductor layer with titanium and the metal material with a copper series metal material, wirings consisting of a copper series metal material of low resistance and having high electro-migration durability can be formed easily.

Further, in the semiconductor device according to the present invention, since the first conductor layer having a first deposition overvoltage as a deposition overvoltage is formed to a region including the inner surface of the wiring channels formed in an insulation film on a semiconductor substrate, a second conductor layer having a second deposition overvoltage as a deposition overvoltage is formed thereon after the formation of the first conductor layer so as to cover a region except for the inner surface of the wiring channels, further, a metal film of metal material deposited by a plating treatment at a deposition overvoltage higher than the first deposition overvoltage and lower than the second deposition overvoltage is formed to the first conductor layer, and the metal film is polished by a chemical and mechanical polishing method to form wirings, wirings of high performance filled uniformly in the wiring channels can be obtained even in a case of fine wiring channels.

Further, when making the first conductor layer with titanium nitride, the second conductor layer with titanium and the metal material with the copper series metal material is applied as the metal material, wirings consisting of a copper series metal material with low resistance and having high electro-migration durability can be obtained easily.

Further, since the selective plating method according to the present invention comprises the steps of, forming a first conductor layer having a first deposition overvoltage as a deposition overvoltage to the surface of a material to be plated at a portion including a plating region, then forming thereon a second conductor layer having a second deposition overvoltage higher than the first deposition overvoltage as a deposition overvoltage so as to cover a region except for the plating region, and then dipping the material to be plated in a plating solution and applying a plating treatment at a deposition overvoltage higher than the first deposition overvoltage and lower than the second deposition overvoltage, plating is applied only to the portion in which the first conductor layer is exposed, so that plating can be applied selectively.

In this method, when the first conductor layer is formed to a region including the inner surface of the concaved portion, and the second conductor layer is formed so as to cover the region except for the inner surface of the concaved portion, a uniform metal film with no voids can be formed, particularly, also in a case of fine concaved portion.

Further, when making the first conductor layer with titanium nitride, the second conductor layer with titanium and the metal material with the copper series metal material, a metal film consisting of the copper series metal material with low resistance and having high electro-migration durability can be obtained easily.

What is claimed is:

1. A method of forming wirings for a semiconductor device, which comprises the steps of forming concaved wiring channels in an insulation film formed on a semiconductor substrate, forming a first conductor layer having a first deposition overvoltage as a deposition overvoltage required for depositing a copper series metal material in a plating solution to the surface of the simulation film at least including the inner surface of the concaved portion of the wiring channels, forming a second conductor layer having a second deposition overvoltage higher than the first deposition overvoltage as the deposition overvoltage to the surface of the insulation film so as to cover a region except for the inner surface of the concaved portion of the wiring channels, subsequently, dipping at least the inner surface of the concaved portion of the wiring channels into the plating solution and applying a plating treatment to the region in which the first conductor layer is exposed at a deposition overvoltage higher than the first deposition overvoltage and lower than the second deposition overvoltage to deposit the copper series metal material, and polishing the deposited metal material thereby forming wirings.

2. A method of forming wirings for a semiconductor device as defined in claim 1, wherein the second conductor layer is formed by a highly anisotropic deposition method.

3. A method of forming wirings for a semiconductor device as defined in claim 1 or 2, wherein the wiring channel has an aspect ratio from 1 to 5 and a width of 1.0 μm or less.

4. A method of forming wirings for a semiconductor device as defined in any one of claims 1 to 3, which is applied to a semiconductor device of a multi-layered wiring structure, and in which the first conductor layer is formed to the surface of the insulation film including the inner surface of the concaved portion of the wiring channels and then the second conductor layer is formed thereon.

5. A method of forming wirings for a semiconductor device as defined in any one of claims 1 to 4, wherein the deposited metal material is polished by a chemical and mechanical polishing method.

6. A method of forming wirings for a semiconductor device as defined in any one of claims 1 to 5, wherein the first conductor layer is made of titanium nitride, the second conductor layer is made of titanium and the metal material is made of a copper series metal material.

7. A selective plating method of selectively forming plating, which comprises the steps of forming a first conductor layer having a first deposition overvoltage as a deposition overvoltage required for depositing a metal material in a plating solution to a portion including at least a plating region to be plated in the surface of a material to be plated, forming a second conductor layer having a second deposition overvoltage higher than the first deposition overvoltage as the deposition overvoltage to the surface of the material to be plated so as to cover a region except for the plating region, subsequently, and dipping the material to be plated into the plating solution and applying a plating treatment to the region in which the first conductor layer is exposed at a deposition overvoltage higher than the first deposition overvoltage and lower than the second deposition overvoltage.

8. A selective plating method as defined in claim 7, wherein the first conductor layer is formed to a region at least including the inner surface of the concaved portion, and the second conductor layer is formed so as to cover a region except for the inner surface of the concaved portion.

9. A selective plating method as defined in claim 7 or 8, wherein the first conductor layer is made of titanium nitride, the second conductor layer is made of titanium and the metal material is made of a copper series metal material.

* * * * *